United States Patent [19]

Stalzer

[11] Patent Number: 5,933,794
[45] Date of Patent: *Aug. 3, 1999

[54] SCALABLE PARALLEL PROCESSING APPARATUS AND METHOD FOR PERFORMING FAST MULTIPOLE SCATTERING CALCULATIONS

[75] Inventor: Mark A. Stalzer, Agoura, Calif.

[73] Assignee: Hughes Electronics Corporation, El Segundo, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/805,489

[22] Filed: Feb. 25, 1997

[51] Int. Cl.⁶ ..................................................... G06F 15/16
[52] U.S. Cl. ...................... 702/123; 702/186; 395/200.3; 395/200.31; 395/674; 395/677
[58] Field of Search ..................................... 364/480–483, 364/131, 133, 524, 550, 551.01, 580, 601, 602, 705, 801, 802, 807–809, 823, 838, 578, 528.31, 41; 324/638; 343/726, 728, 729, 855; 395/200.3, 200.31, 680, 670, 672, 674–677; 702/79, 57, 62, 122, 123, 176, 177, 178, 182, 186

[56] References Cited

U.S. PATENT DOCUMENTS

| | | | |
|---|---|---|---|
| 5,357,632 | 10/1994 | Pian et al. | 395/200.31 |
| 5,537,593 | 7/1996 | Diamond et al. | 395/680 |
| 5,625,836 | 4/1997 | Barker et al. | 395/200.44 |
| 5,629,845 | 5/1997 | Liniger | 364/578 |
| 5,659,683 | 8/1997 | Kawano et al. | 364/550 |

OTHER PUBLICATIONS

R.F. Harrington, *Field Computation By Moment Methods*, MacMillian, New York, NY, 1968. (No date with month).
V. Rokhlin, *Rapid Solution Of Integral Equations Of Classical Potential Theory*, J. Comp. Phys., 60 (1985), pp. 187–207, (Sep. 1985).
R. Coifman, V. Rokhlin, and S. Wandzura, *The Fast Multipole Method: A Pedestrian Prescription*, IEEE Antennas and Propagation Society Magazine, Jun. 1993, pp. 7–12.

M. A. Stalzer, *Parallelizing The Fast Multipole Method for the Helmholtz Equation*, Proceedings of the Seventh SIAM Conference on Parallel Processsing for Scientific Computing, Feb. 1995, pp. 325–330.

M. A. Stalzer, *A Parallel Fast Multipole Method for the Helmholtz Equation*, Parallel Processing Letter, 5 (1995), pp. 263–274. (No date with month).

*Primary Examiner*—Hal Dodge Wachsman
*Attorney, Agent, or Firm*—V. D. Duraiswamy; M. W. Sales

[57] ABSTRACT

A scalable parallel processing method and apparatus for performing fast multipole method (FMM) scattering calculations. The processing method is preferably implemented on a parallel multi-processor wherein a plurality of processors communicate with each other via a data communications network. The multiple processors work in tandem to solve a particular problem, which in the disclosed embodiment involves simulating an object (or scatterer) mathematically by using the fast multipole method (FMM) to calculate scattering amplitudes. The present invention provides a method and apparatus that organizes and carries out FMM operations in a manner that minimizes or eliminates the effect of time spent on sharing information between processors. According to the present invention, the method, essentially masks certain FMM information sharing tasks by performing them concurrently with other FMM computational tasks.

5 Claims, 6 Drawing Sheets

SCALABLE PARALLEL PROCESSING APPARATUS AND METHOD FOR PERFORMING FAST MULTIPOLE SCATTERING CALCULATIONS

STATEMENT OF RIGHTS OWNED

This invention was made with government support under contract MDA972-95-C-0021 awarded by the Department of the Army. The government has certain rights in this invention.

BACKGROUND OF THE INVENTION

1. Field of the Invention

The present invention relates in general to electromagnetic scattering calculations. More specifically, it relates to an efficient and time-saving apparatus and method for using parallel multi-processors and the Fast Multipole Method (FMM) to perform electromagnetic scattering calculations.

2. Description of Related Art

Figure 1:
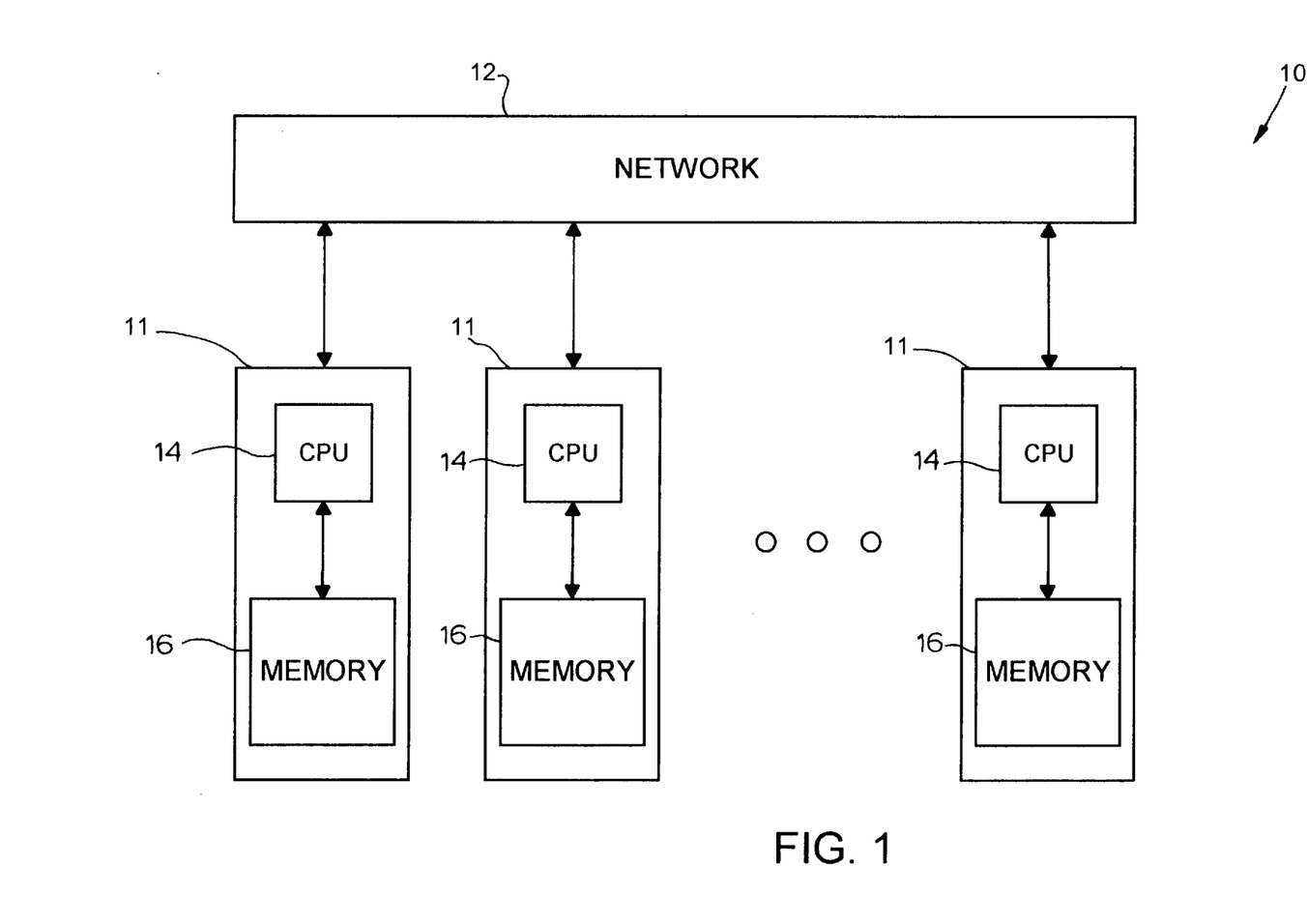
FIG. 1 is a diagram illustrating a parallel processing apparatus capable of implementing the method of the present invention.

Much of the computing world is moving from sequential, single processor configurations to parallel processor configurations. One example of a parallel processor configuration 10 is shown in FIG. 1. As illustrated, the configuration 10 includes a plurality of asynchronously executing processors 11 in communication with one another via a communications network 12. Each processor 11 generally includes at least a CPU 14 and a memory 16. In performing "parallel processing", the software functions or processes that are associated with a particular task and/or computation are divided and distributed among the various processors 11 connected via the network 12. Additionally, the particular task or computation may require that the processors 11 share information with each other via the network 12.

Figure 2A:
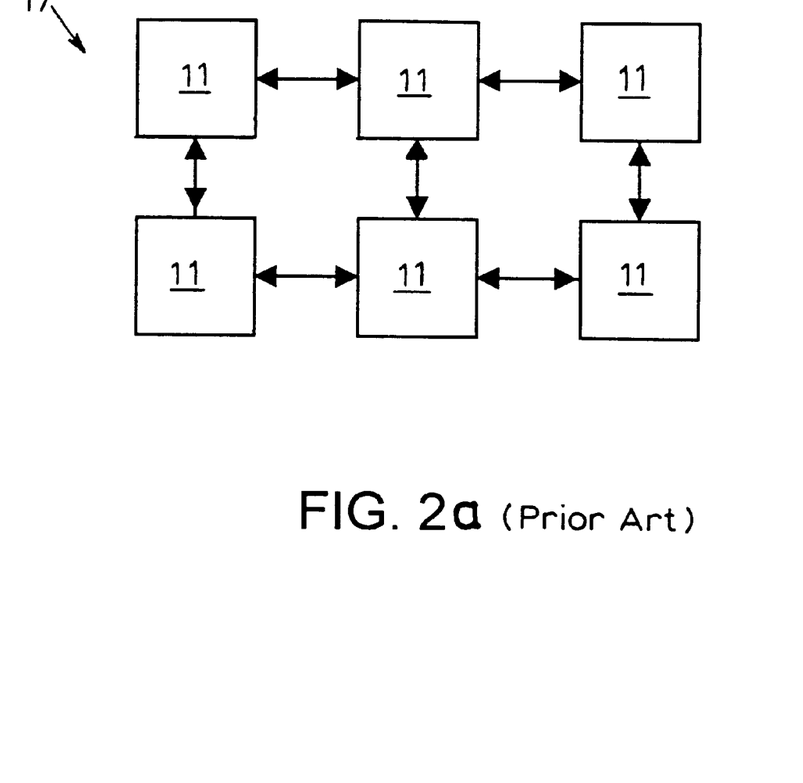
FIG. 2a is a diagram illustrating a mesh parallel processing network also capable of implementing the method of the present invention.
Figure 2B:
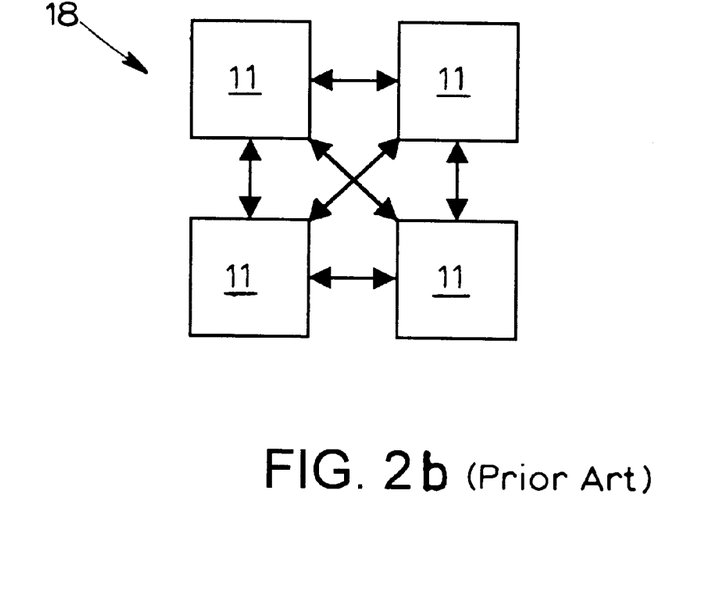
FIG. 2b is a diagram illustrating a fully-connected parallel processing network also capable of implementing the method of the present invention.

Parallel multi-processor networks may be embodied in a variety of other configurations. For example, FIGS. 2a and 2b illustrate a "mesh" configuration 17 and a "fully connected" configuration 18, respectively. In a six-processor mesh configuration 17 any processor 11 is at most three "hops" from any other processor 11. The fully connected network 18 shown in FIG. 2b places every processor 11 in direct communication with every other processor 11, and within one "hop" of every other processor 11. The number of hops that separates the processors is directly related to the ease with which information is shared among the processors. Reducing the number of hops in a given communication path generally shortens the communication time for that path.

The general goal of parallel multi-processor networks is to require less processing time than a single processor or non-parallel processors. Adding more processors to a parallel multi-processor network adds computing power, which, in theory, should reduce the overall execution time for completing tasks. However, for computations that require the processors to share information, the time spent on distributing shared information to the processors can reduce, and in many cases cancel, whatever time savings may have been achieved by adding processors to the network.

The "speedup" value is a measurement of the effectiveness of adding processors to a parallel multi-processor network. As shown below in equation 1, speedup is the ratio of the time it takes to execute an algorithm for a problem of size N on one processor over the time it takes to execute an algorithm for a problem of size N on P processors.

$$Speedup = \frac{T(N, 1)}{T(N, P)} \quad \text{(Equation 1)}$$

Figure 3A:
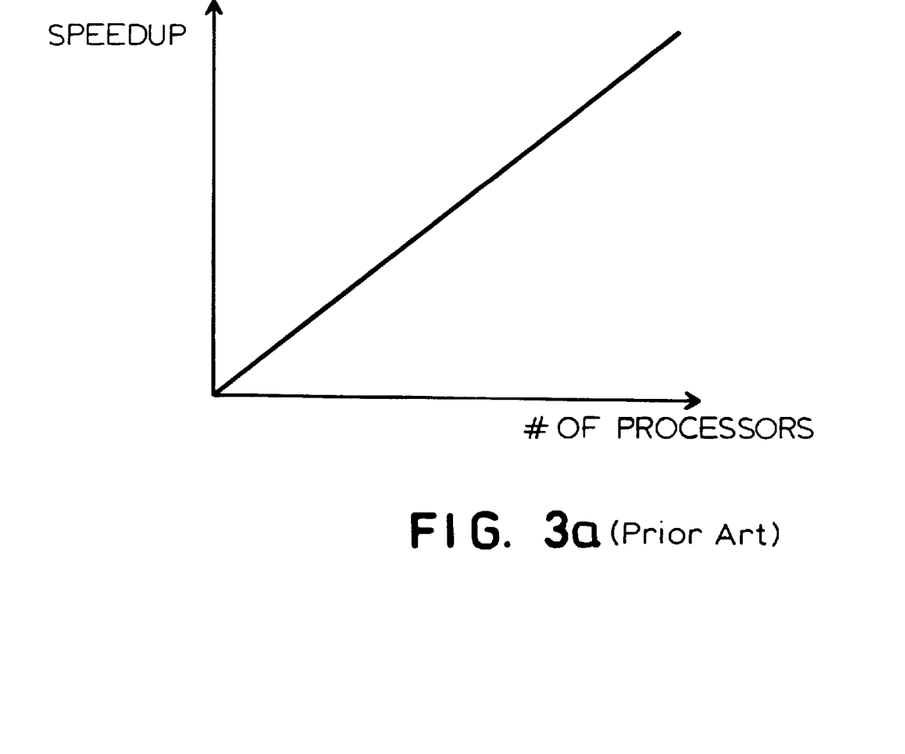
FIG. 3a is a graph illustrating the "speedup" vs. the "number of processors" for a scalable system.
Figure 3B:
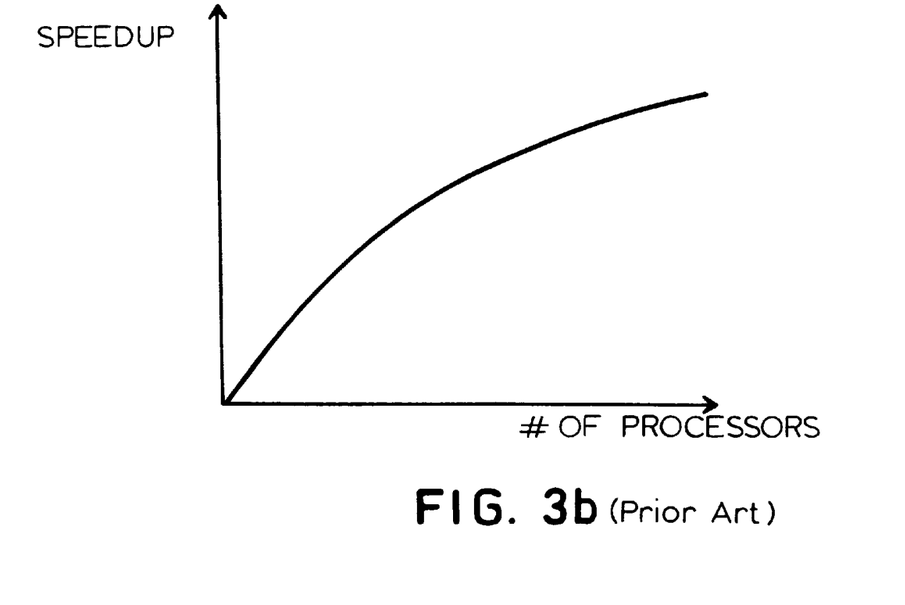
FIG. 3b is a graph illustrating the "speedup" vs. the "number of processors" for a non-scalable system.

If the above ratio is approximately P, the algorithm is referred to as scalable. In other words, for every added processor there is a proportional, linear decrease in the execution time. FIGS. 3a and 3b illustrate scalable and non-scalable systems, respectively. However, for computations that require the parallel processors to share information, the time spent on distributing the shared information to the processors makes it difficult to achieve the scalability illustrated in FIG. 3a.

When electromagnetic energy is incident on a conductive material, surface currents are induced on the object being irradiated. These surface currents radiate electromagnetic energy which can be detected and measured. This is the basic principle by which radar detection systems work.

Figure 4:
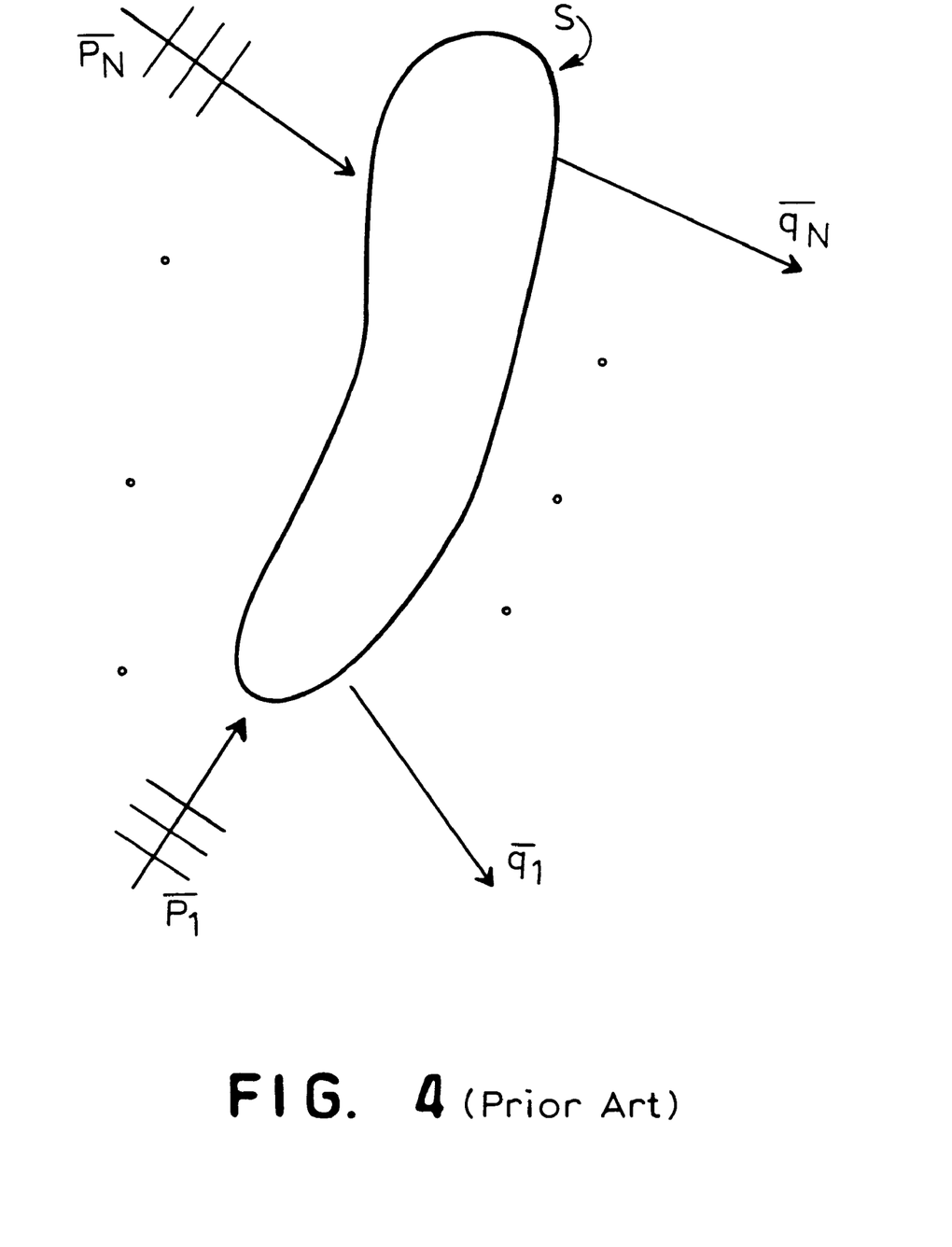
FIG. 4 is a diagrammatic illustration of a scatterer S being irradiated with plane waves P and reradiating fields Q.

Referring to FIG. 4, an object, referred to as a scatterer S, is shown. The scatterer S represents any conductive object that can be irradiated with plane waves of electromagnetic energy. $P_1$ to $P_N$ represent N different plane waves that irradiate the scatterer. $Q_1$ to $Q_N$ represent radiated energy from the scatterer resulting from the surface currents induced on the object by the irradiating plane waves. This energy from the scatterer S is also known as scatter or scattering amplitude. The scattering amplitude is the ratio of the reflected (or scattered) energy to the incident energy. For many applications it is necessary to irradiate the scatterer S from many different angles on many different sides, often referred to as look angles or right hand sides, when measuring scattering amplitude.

Scattering amplitude measurements are useful in a variety of applications such as circuit and antenna modeling. However, the most common use of scatter is in radar systems. Radar systems rely on the principle that all conductive objects re-radiate incident electromagnetic energy in patterns that are unique for that object's particular size, shape and other physical characteristics. In other words, all unique objects possess unique "electromagnetic fingerprints". Once the scatter information of an object has been thoroughly determined in all directions, this information can be used to identify that object. Many defense-related aircraft are designed to produce as little scatter as possible in order to minimize the likelihood of the aircraft being detected by an enemy radar system.

The electromagnetic scatter of an object can be determined by empirical methods or by simulation/computation methods. Empirical methods can be costly and time consuming to implement. For example, making scatter measurements is time consuming because the scatterer must be characterized in both the horizontal and the vertical planes. In other words, the scattering characteristics of the scatterer must be know from any point in space surrounding the object. Additionally, empirical scatter measurements are typically made from an actual scatterer by placing the scatterer on a table that rotates during the measurements. When the scatterer is a large and/or expensive object such as an aircraft, it is obviously very expensive to conduct such measurements for every form of scatterer under consideration.

Figure 5:
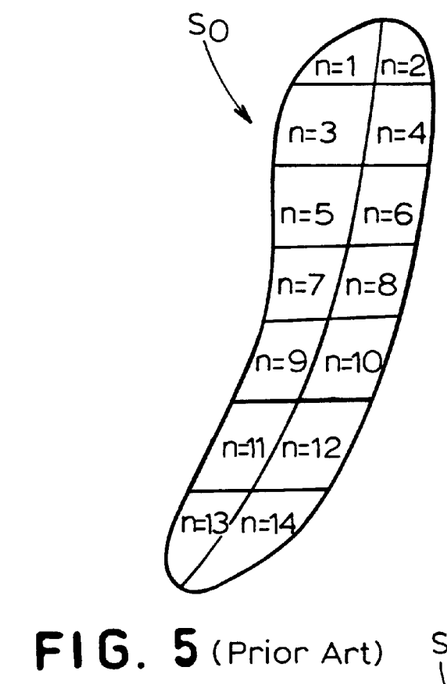
FIG. 5 shows a scatterer $S_0$ segmented into a number of sections for use in performing general computational methods.

Computational methods use mathematical models to determine the scattering characteristics of a given object, thus eliminating the need to actually construct the object. In general, computational methods resolve an irradiating source into surface currents on the scatterer. Once the surface currents are known, the re-radiated field from the scatterer can be computed. Conventional computational methods break the scatterer into N small pieces (unknowns) for computational analysis. Note that a higher number of unknowns results in a more precise simulation. FIG. 5 illustrates a scatterer $S_0$ broken into N=14 different components. Equation 2 forms the fundamental basis for known computational methods.

$$ZI=V \quad \text{(Equation 2)}$$

The variable V is given by the characteristics of the incident electromagnetic plane wave.

Equation 2 also relies on the impedance matrix representation Z of the scatterer $S_0$. The impedance matrix Z is determined, through known methods, by the geometry and the material composition of the scatterer. Note that the size of Z is directly related to the number of sections N that the scatterer has been broken into. Specifically, the matrix Z has the dimensions N by N or $N^2$. Based on the above development, the only tasks that remain are the determination of the current vector I and the re-radiated energy which follows directly from V and I.

A first method of determining I is to simply solve Equation 2 for I. This requires the calculation of $Z^{-1}$ as shown in Equation 3.

$$I=Z^{-1}V \quad \text{(Equation 3)}$$

The calculation of $Z^{-1}$ requires $N^3$ calculations or $N^3$ time. Note that the number of calculations directly relates to the time it takes to make the calculations. Therefore, $N^3$ calculations can be referred to as taking $N^3$ time. This method works for sufficiently small N values. However, most practical simulations require N values on the order of 100,000 or larger. With N=100,000 unknowns, massive amounts of computing power and memory are necessary. Thus, larger N values often require the use of an expensive super-computer to calculate $Z^{-1}$. One of the largest N values ever used to calculate $Z^{-1}$ was N=225,000. The computation resources used for this operation cost about $20–$30 million dollars.

An alternative to calculating the inverted Z matrix is to iteratively solve Equation 4 based on changing I'. An initial value for I' is chosen, and, if the results of the calculation do not agree with Equation 4, the next value of I' is determined by known methods. This iterative solution continues until V−ZI' is acceptably close to 0.

$$V-ZI'=0 \quad \text{(Equation 4)}$$

This method requires $N^2$ calculations per iteration in I'. Theoretically, N iterations in I' are required to make V−ZI' exactly 0. Thus, this method yields an exact result only after $N^3$ calculations ($N^2$ calculations per iteration and N iterations). In practice, however, fewer iterations in I' are needed in order to obtain reasonable accuracy. Accordingly, this alternative method, in practice, provides some computational advantage over the method that relies on inverting the Z matrix.

Figure 6:
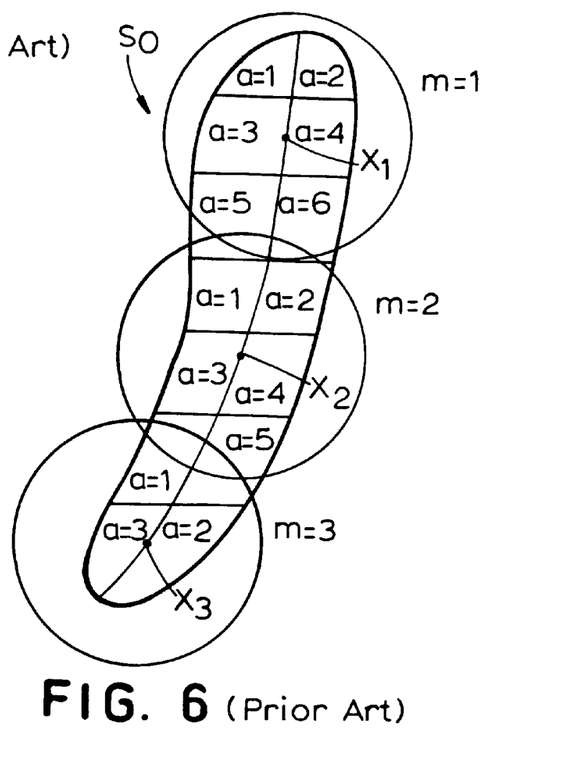
FIG. 6 shows a segmented scatterer $S_0$ grouped into sections M for use in the fast multipole method (FMM)

A further reduction in time can be achieved through using the Fast Multipole Method (FMM) which requires $N^{3/2}$ time per iteration, instead of $N^2$ time. FMM uses a similar scatterer segmentation method to that shown in FIG. 5. However, as shown in FIG. 6, FMM places the N small pieces (unknowns) into M groups, preferably $M \ N^{1/2}$. For notational purposes, a particular section (element) of the scatterer which was referred to as "n" in FIG. 5 is now referred to by a group number and an element number within that group (m, a). For example, n=9 in a FIG. 5 corresponds to (2, 3) in FIG. 6.

Collecting the scatterer elements into groups allows for the decomposition of the impedance matrix Z into sparse components Z', V, and T such that Equation 5 holds.

$$Z \approx Z'+VTV^\dagger \quad \text{(Equation 5)}$$

Fields due to currents within a group m are tabulated at K points, or far-field directions, on a unit sphere. In Equation 5, T is the translation operator, which serves to translate tabulated fields between groups that are far away. At a given group, the translated fields from all far away groups are summed and used to compute the interactions on the current elements within the given group. For interactions due to groups nearby a given group, a sparse portion Z' of the regular impedance matrix is used. The variables used in Equation 5 can all be calculated from Equations 6–8.

$$T_{mm'k} = \sum_L i^l(2l+1)h_l^{(1)}(k_0 X_{mm'})P_l(\hat{k}\cdot\hat{X}_{mm'}) \quad \text{(Equation 6)}$$

In Equation 6, the number inserted for the variable L depends on the desired accuracy, $\hat{k}$ is the unit vector in the kth far field direction, $\hat{X}_{mm'}$ is the unit vector from the center of the group m to group m' and $h_1^{(1)}$, $P_1$ are the Hankel function and the Legendre polynomial, respectively, of order 1.

$$V_{nk}=e^{ik\cdot(xn-Xm)} \quad \text{(Equation 7)}$$

$$Z'_{nn'}=G(r) \quad \text{(Equation 8)}$$

In equations 7 and 8, $x_n$ is the location of the unknown n (See FIG. 6), $X_m$ is the center of the group m that contains n, $r=|x_n-x_{n'}|$ for unknowns n, n' in nearby groups, and G(r) is the Green function.

Additional details regarding FMM can be found in the following documents: R. F. Harrington, *Field Computation By Moment Methods,* MacMillian, New York, N.Y., 1968; R. Coifman, V. Rokhlin, and S. Wandzura, *The Fast Multipole Method: A Pedestrian Prescription,* IEEE Antennas and Propagation Society Magazine, June 1993, pages 7–12; V. Rokhlin, *Rapid Solution Of Integral Equations Of Classical Potential Theory,* J. Comp. Phys., 60 (1985), pages 187–207; M. A. Stalzer, *Parallelizing The Fast Multipole Method For The Helmholtz Equation,* Proceedings of the Seventh SIAM Conference on Parallel Processing for Scientific Computing, February 1995, pages 325–330; and M. A. Stalzer, *A Parallel Fast Multipole Method For The Helmholtz Equation,* Parallel Processing Letter, 5 (1995), pages 263–274. The entire disclosure of each of the above-listed documents is incorporated herein by reference.

A substantial amount of memory can be saved by calculating the components of $Z'+VTV^\dagger$ as needed to form the product ZI'. Computing an exponential function uses more computer resources than performing a simple multiplication. It is therefore desirable to compute a small piece of each component, then use it many times. This fits well with the solution of scattering problem because multiple look angles, or right hand sides, must often be calculated in order to provide a sufficiently thorough representation of the scatterer.

Because scattering calculations are desired for very large scatterers, there is a need to couple the FMM for electromagnetic calculations with the enhanced speed of scalable parallel processing. Providing a scalable parallel processing algorithm for the FMM would allow scattering calculations to be executed on a large number of available processors. Accordingly, the present invention is directed at providing a method and apparatus that performs FMM on a scalable multi-processor network.

SUMMARY OF THE INVENTION

The present invention provides a scalable parallel processing method and apparatus for performing FMM scattering calculations. The invention is preferably implemented on a parallel multi-processor wherein a plurality of processors communicate with each other via a data communications network. The multiple processors work in tandem to solve a particular problem, which in the disclosed embodiment involves simulating an object (or scatterer) mathematically by using FMM to calculate scattering. Thus, the various operations and calculations that are performed in FMM must be divided among the processors in the network.

The general goal of parallel multi-processor networks is to require less processing time than a single processor or non-parallel processors. Adding more processors to a parallel multi-processor network adds computing power, which, in theory, should reduce the overall execution time for completing tasks. However, FMM computations require that the processors share information, so the time spent distributing shared information to the processors can reduce and in many cases cancel whatever time savings may have been achieved by adding processors to the network. The present invention provides a method and apparatus that organizes and carries out FMM calculations in a manner that minimizes or eliminates the effect of time spent on sharing information between processors.

Figure 7:
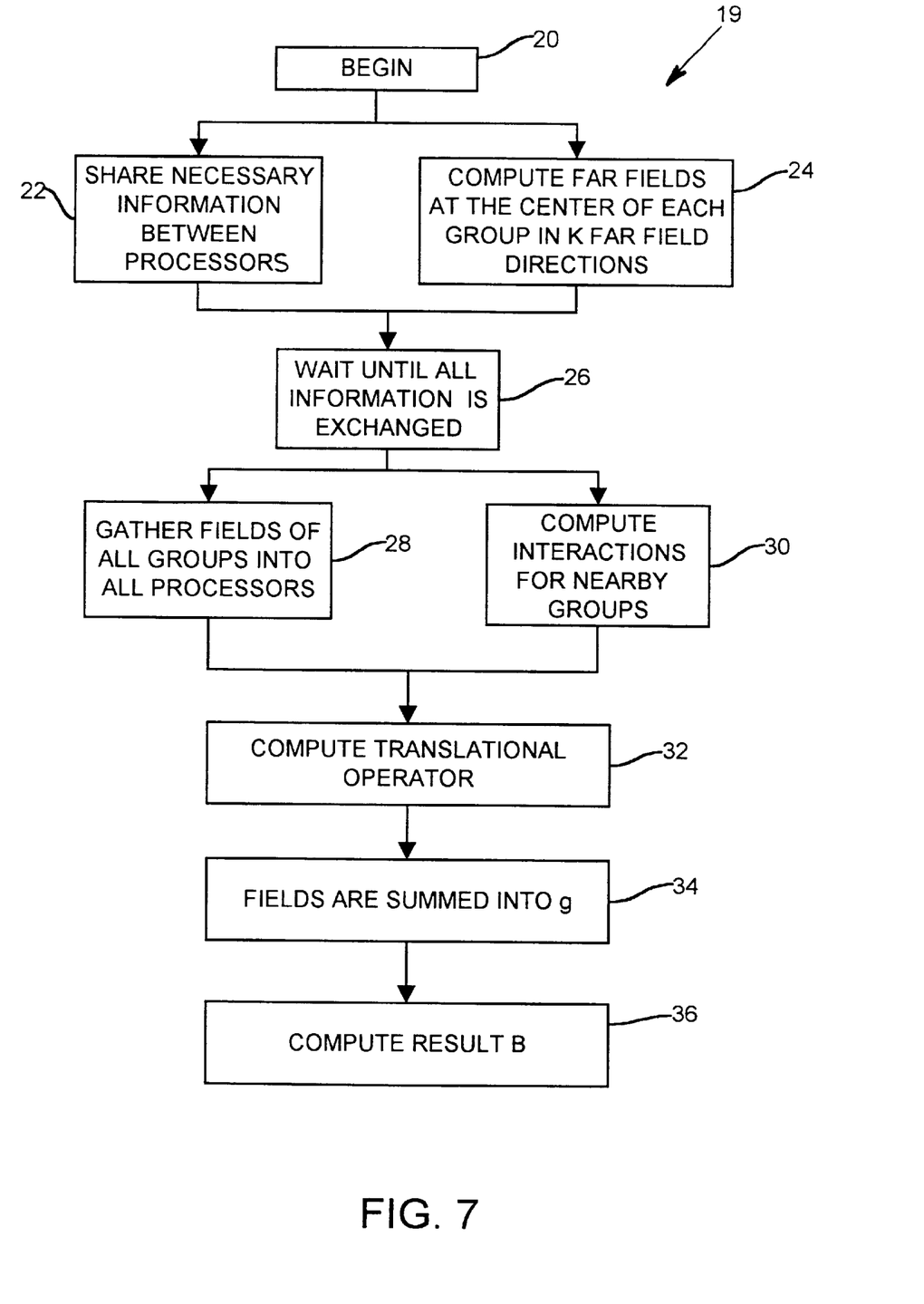
FIG. 7 is a flow diagram illustrating an example of the method of the present invention. The flow diagram outlines software steps that are performed in implementing a scalable parallel FMM operation according to the present invention.

According to the present invention, the method, which is shown in FIG. 7, efficiently allocates FMM processing tasks among the parallel processors 11 shown in FIGS. 1, 2a or 2b. The allocation protocol of the method essentially masks certain FMM information sharing tasks by performing them concurrently with other FMM computational tasks. These concurrent allocations are illustrated first at blocks 22 and 24 of the flow diagram 19. The first group of information is shared among the processors according to known FMM procedures at block 22, while concurrently the initial FMM far field calculations are being performed at block 24. Accordingly, whichever of these two categories of tasks is shortest in duration, is essentially eliminated from the overall time costs of the FMM operation. Likewise, at blocks 28 and 30, the FMM far field information for far away groups is gathered into all of the processors, while concurrently the FMM interactions for nearby groups are calculated. Again, whichever of these two categories of tasks is shortest in duration, is essentially eliminated from the overall time costs of the FMM operation.

The apparatus of the present invention includes a parallel multi-processor apparatus comprising a communications medium and a plurality of processors in communication with each other via said communications medium. The plurality of processors each comprise scatter programming instructions that perform selected operations associated with scatter calculations. The communications medium includes control program instructions that control:

i) exchanging selected information between selected ones of said processors, and ii) said plurality of processors in executing said scatter programming instructions.

At least some of the exchange of selected information is substantially independent of at least some of scatter programming instructions. Additionally the exchange occurs at the same time that the scatter programming instructions are being executed by the processor.

Preferably, the scatter calculations performed by the above-described apparatus comprise fast multipole methods, the selected information involved in said exchange comprises information related to a current vector I, and the scatter programming instructions compute far field information. The selected information involved in the exchange may also comprise far field information, and the scatter programming instructions could compute nearby interactions.

Preferably, the performance of said scatter calculations has an execution time, and for every processor added to said plurality of processors there is a proportional, linear decrease in said execution time, thereby resulting in a scalable system.

The method of the present invention includes a method of controlling a parallel multi-processor system in calculating scatter values according to the fast multipole method, said parallel multi-processor system including a plurality of processors in communication with each other via a communications medium, said plurality of processors each comprising scatter programming instructions that perform selected operations associated with said scatter calculations. The method comprises exchanging selected information associated with said scatter calculations between selected ones of said processors, and controlling said plurality of processors to execute said scatter programming instructions simultaneously with said exchange of said selected information. At least some of the selected information is substantially independent of at least some of scatter programming instructions.

The scatter calculations of the method preferably comprise fast multipole methods, such that the information involved in said exchange comprises information related to a current vector I, and the scatter programming instructions compute far field information. Also, the information involved in said exchange can comprise far field information, while the scatter programming instructions compute nearby interactions. Performance of said scatter calculations has an execution time, and for every processor added to said plurality of processors there is a proportional, linear decrease in said execution time.

The invention itself, together with further objects and attendant advantages, will best be understood by reference to the following detailed description, taken in conjunction with the accompanying drawings.

DESCRIPTION OF THE PREFERRED EMBODIMENT

By the way of example only, FIGS. 1, 2a and 2b illustrate parallel processor apparatus for performing the method of the present invention. A general parallel processor configuration 10 is shown in FIG. 1. As illustrated, the configuration 10 includes a plurality of asynchronously executing processors 11 in communication with one another via a communications medium 12. The communications medium 12 may take a variety of forms including local area networks, remote networks, hardwired networks, wireless networks, or other "communications" processors dedicated solely to providing communications between the processor 11 that perform the calculations. Preferably, the medium 12 is a communications network. Each processor 11 generally includes at least a CPU 14 and a memory 16. In performing "parallel processing", the software functions or processes that are associated with a particular task and/or computation are divided and distributed among the various processors 11 connected via the network 12. Additionally, the particular task or computation may require that the processors 11 share information with each other via the network 12.

FIGS. 2a and 2b illustrate "mesh" and "fully connected" parallel processor configurations 17, 18, respectively. In a six-processor mesh configuration 17 any processor 11 in the network is at most three "hops" from any other processor 11. The fully connected network 18 shown in FIG. 2b places every processor 11 in direct communication with every other processor 11, and within one "hop" of every other processor 11. The number of hops that separates the processors is directly related to the ease with which information is shared among the processors. Reducing the number of hops in a given communication path generally shortens the communication time for that path. Note, other network topologies may be used.

The general goal of parallel multi-processor networks is to require less processing time than a single processor or non-parallel processors. Adding more processors to a parallel multi-processor network adds computing power, which, in theory, should reduce the overall execution time for completing tasks. However, for computations that require the processors to share information, the time spent on distributing shared information to the processors can reduce, and in many cases cancel, whatever time savings may have been achieved by adding processors to the network.

The "speedup" value is a measurement of the effectiveness of adding processors to a parallel multi-processor network. As shown below in equation 1, speedup is the ratio of the time it takes to execute an algorithm for a problem of size N on one processor over the time it takes to execute an algorithm for a problem of size N on P processors.

$$Speedup = \frac{T(N, 1)}{T(N, P)} \quad \text{(Equation 1)}$$

If the above ratio is approximately P, the algorithm is referred to as scalable. In other words, for every added processor there is a proportional, linear decrease in the execution time. FIGS. 3a and 3b illustrate scalable and non-scalable systems, respectively. However, for computations that require the parallel processors to share information, the time spent on distributing the shared information to the processors makes it difficult to achieve the scalability illustrated in FIG. 3a.

When electromagnetic energy is incident on a conductive material, surface currents are induced on the object being irradiated. These surface currents radiate electromagnetic energy which can be detected and measured. This is the basic principle by which radar detection systems work.

Referring to FIG. 4, an object, referred to as a scatterer S, is shown. The scatterer S represents any conductive object that can be irradiated with plane waves of electromagnetic energy. $P_1$ to $P_N$ represent N different plane waves that irradiate the scatterer. $Q_1$ to $Q_N$ represent radiated energy from the scatterer resulting from the surface currents induced on the object by the irradiating plane waves. This energy from the scatterer S is also known as scatter or scattering amplitude. For many applications it is necessary to irradiate the scatterer S from many different angles on many different sides, often referred to as look angles or right hand sides, when measuring scattering amplitude.

Scattering amplitude measurements are useful in a variety of applications such as circuit and antenna modeling. However, the most common use of scatter is in radar systems. Radar systems rely on the principle that all conductive objects re-radiate incident electromagnetic energy in patterns that are unique for that object's particular size, shape and other physical characteristics. In other words, all unique objects possess unique "electromagnetic fingerprints". Once the scatter information of an object has been thoroughly determined in all directions, this information can be used to identify that object. Many defense-related aircraft are designed to produce as little scatter as possible in order to minimize the likelihood of the aircraft being detected by an enemy radar system.

The electromagnetic scatter of an object can be determined by empirical methods or by simulation/computation methods. Empirical methods can be costly and time consuming to implement. For example, making scatter measurements is time consuming because the scatterer must be characterized in both the horizontal and the vertical planes. In other words, the scattering characteristics of the scatterer must be know from any point in space surrounding the object. Additionally, empirical scatter measurements are typically made from an actual scatterer by placing the scatterer on a table that rotates during the measurements. When the scatterer is a large and/or expensive object such as an aircraft, it is obviously very expensive to conduct such measurements for every form of scatterer under consideration.

Computational methods use mathematical models to determine the scattering characteristics of a given object, thus eliminating the need to actually construct the object. In general, computational methods resolve an irradiating source into surface currents on the scatterer. Once the surface currents are known, the re-radiated field from the scatterer can be computed. Conventional computational methods break the scatterer into N small pieces (unknowns) for computational analysis. Note that a higher number of unknowns results in a more precise simulation. FIG. 5 illustrates a scatterer $S_0$ broken into N=14 different components. Equation 2 forms the fundamental basis for known computational methods.

$$ZI = V \quad \text{(Equation 2)}$$

The variable V is given by the characteristics of the incident electromagnetic plane wave.

Equation 2 also relies on the impedance matrix representation Z of the scatterer $S_0$. The impedance of the scatterer material is known, and the matrix Z is determined, through known methods, by the geometry and the material composition of the scatterer. Note that the size of Z is directly related to the number of sections N that the scatterer has been broken into. Specifically, the matrix Z has the dimensions N by N or $N^2$. Based on the above development, the only tasks that remain are the determination of the current vector I and the re-radiated energy which follows directly from V and I.

A first method of determining I is to simply solve Equation 2 for I. This requires the calculation of $Z^{-1}$ as shown in Equation 3.

$$I=Z^{-1}V \quad \text{(Equation 3)}$$

The calculation of $Z^{-1}$ requires $N^3$ calculations or $N^3$ time. Note that the number of calculations directly relates to the time it takes to make the calculations. Therefore, $N^3$ calculations can be referred to as taking $N^3$ time. This method works for sufficiently small N values. However, most practical simulations require N values on the order of 100,000 or larger. With N=100,000 unknowns, massive amounts of computing power and memory are necessary. Thus, larger N values often require the use of an expensive super-computer to calculate $Z^{-1}$. One of the largest N values ever used to calculate $Z^{-1}$ was N=225,000. The computation resources used for this operation cost about $20–$30 million dollars.

An alternative to calculating the inverted Z matrix is to iteratively solve Equation 4 based on changing I'. An initial value for I' is chosen, and, if the results of the calculation do not agree with Equation 4, the next value of I' is determined by known methods. This iterative solution continues until V−ZI' is acceptably close to 0.

$$V-ZI'=0 \quad \text{(Equation 4)}$$

This method requires $N^2$ calculations per iteration in I'. Theoretically, N iterations in I' are required to make V−ZI' exactly 0. Thus, this method yields an exact result only after $N^3$ calculations ($N^2$ calculations per iteration and N iterations). In practice, however, far fewer iterations in I' are needed in order to obtain reasonable accuracy. Accordingly, this alternative method, in practice, provides some computational advantage over the method that relies on inverting the Z matrix.

A further reduction in time can be achieved through using the Fast Multipole Method (FMM) which requires $N^{3/2}$ time per iteration, instead of $N^2$ time. FMM uses a similar scatterer segmentation method to that shown in FIG. 5. However, as shown in FIG. 6, FMM places the N small pieces (unknowns) into M groups, preferably $M N^{1/2}$. For notational purposes, a particular section (element) of the scatterer which was referred to as "n" in FIG. 5 is now referred to by a group number and an element number within that group (m, a). For example, n=9 in FIG. 5 corresponds to (2, 3) in FIG. 6.

Collecting the scatterer elements into groups allows for the decomposition of the impedance matrix Z into sparse components Z', V, and T such that Equation 5 holds.

$$Z \approx Z'+VTV^\dagger \quad \text{(Equation 5)}$$

Fields due to currents within a group m are tabulated at K points, or far-field directions, on a unit sphere. In Equation 5, T is the translation operator, which serves to translate tabulated fields between groups that are far away. At a given group, the translated fields from all far away groups are summed and used to compute the interactions on the current elements within the given group. For interactions due to groups nearby a given group, a sparse portion Z' of the regular impedance matrix is used. The variables used in Equation 5 can all be calculated from Equations 6–8.

$$T_{mm'k} = \sum_L i^l(2l+1)h_l^{(1)}(k_0 X_{mm'})P_l(\hat{k}\cdot\hat{X}_{mm'}) \quad \text{(Equation 6)}$$

In Equation 6, the number inserted for the variable L depends on the desired accuracy, $\hat{k}$ is the unit vector in the kth far field direction, $\hat{X}_{mm'}$ is the unit vector from the center of the group m to group m' and $h_1^{(1)}$, $P_1$ are the Hankel function and the Legendre polynomial, respectively, of order 1.

$$V_{nk}=e^{ik\cdot(xn-Xm)} \quad \text{(Equation 7)}$$

$$Z'_{nn'}=G(r) \quad \text{(Equation 8)}$$

In equations 7 and 8, $X_n$ is the location of the unknown n (See FIG. 6), $X_m$ is the center of the group m that contains n, $r=|x_n-x_{n'}|$ for unknowns n, n' in nearby groups, and G(r) is the Green function.

A substantial amount of memory can be saved by calculating the components of $Z'+VTV^\dagger$ as needed to form the product ZI'. Computing an exponential function uses more computer resources than performing a simple multiplication. It is therefore desirable to compute a small piece of each component, then use it many times. This fits well with the solution of scattering problem because multiple look angles, or right hand sides, must often be calculated in order to provide a sufficiently thorough representation of the scatterer.

Because scattering calculations are desired for very large scatterers, there is a need to couple the FMM for electromagnetic calculations with the enhanced speed of scalable parallel processing. Providing a scalable parallel processing algorithm for the FMM would allow scattering calculations to be executed on a large number of available processors. Accordingly, the present invention is directed at providing a method and apparatus that performs FMM on a scalable multi-processor network.

Turning now to FIG. 7, there is illustrated a flow diagram of the method of the present invention. The flow diagram outlines software steps that are performed in implementing a scalable parallel FMM operation according to the present invention. The algorithm described can be modeled on an IBM SP2 system using the MPI communications library. Groups of scatterer sections are allocated to various nodes on a multi-processor system using known load balancing methods.

In practice, the software steps illustrated in FIG. 7 are carried out by the communications network 12 shown in FIG. 1. The network 12 provides a "virtual" communication path between any processor connected to the network and any other processor connected to the network. Accordingly, the basic function of the network 12 is to make it possible for physically separate processors to communicate with each other simply by connecting with the network 12.

According to the present invention, the method shown in FIG. 7 efficiently allocates FMM processing tasks among the parallel processors 11 shown in FIGS. 1, 2a or 2b. The allocation protocol of the method essentially masks the time cost of certain FMM information sharing tasks by performing them concurrently with other FMM computational tasks. These concurrent allocations are illustrated first at blocks 22 and 24 of the flow diagram. The first group of information is shared among the processors according to known FMM procedures at block 22, while concurrently the initial far field calculations are being performed at block 24. Accordingly, whichever of these two categories of tasks is shortest in duration, is essentially eliminated from the overall time costs of the FMM operation. Likewise, at blocks 28 and 30, the far field information for far away groups is gathered into all of the processors (block 28), while concurrently the FMM interactions for nearby groups are calculated. Again, whichever of these two categories of tasks is shortest in duration, is essentially eliminated from the overall time costs of the FMM operation. Thus, the present invention provides a method and apparatus that organizes and carries out FMM calculations in a manner that minimizes or eliminates the effect of time spent sharing information between processors, resulting in a method and apparatus that performs FMM on a scalable multi-processor network.

Referring again to FIG. 7, the details of the program will now be described. The following description is given with respect to processor p. Note that the processor p in the following pseudocode, is the same processor 11 shown in FIGS. 1, 2a and 2b. The term local is used to define all groups m assigned to processor p. Also, nearby for a group m is defined as any interaction that is computed in the Z' term. If the distance between groups is less than L of equation 6, the groups are considered nearby one another. The program begins at a block 20, which is where the iterative solver calls the FMM to form the product ZI. The program proceeds to blocks 22 and 24 simultaneously. Block 22 initiates the sharing of information between processors in the system. The information that is shared in this case are the portions of the current vector I for the points in nearby groups m', on a processor p'≠p. Block 22 initiates a sequence of asynchronous exchanges between processors that have nearby groups. At the same time that the information sharing of block 22 is taking place, block 24 is computing far fields at the center of each group due to the current elements in the group in the K far field directions. This calculation is done for all look angles, Q. The fields are stored in s(q,m,k) for later use.

Block 22 may be represented by the pseudocode below.
for m∈Local (p); p'≠p, m'∈Nearby(m)∩Local(p')
  exchange(I(m,1 . . . $A_m$), I(m',1 . . . $A_{m'}$), p')
That is, for group m on the local processor p and some other processor p' that is not processor p, along with another group m' which is nearby group m and on the other processor p', information is exchanged between processors p and p' regarding the current vector I at all points Am, Am' in groups m and m'.

The functionality of block 24 may be represented by the pseudocode below.
for m∈Local (p)
  for k∈1 . . . K; a∈1 . . . $A_m$ $V(k,a) = e^{-ik(x_{ma} - x_m)}$ for q∈1 . . . Q $s(q,m,k) = \Sigma_{a\in 1 \ldots Am} V(k,a) I(q,m,z)$ That is, for each group m on the local processor p calculate the far fields s in all far field directions k for all unknowns a within group m. The fields are calculated for each look angle q.

As previously stated, blocks 22 and 24 execute at the same time. This is possible because the information used by each block is independent of the other block. In other words, the operations performed at block 22 do not rely on the operations performed at block 24, and may therefore proceed at the same time.

Block 26 is essentially a delay that waits for the execution of blocks 22 and 24 to be completed. Blocks 22 and 24, may be of equal or different duration, however only the longest of the two contributes to the overall time cost. Preferably the communications associated with block 22 are completed before the calculations performed in block 24. The structure of the program 19 is such that communications time is hidden by placing it in parallel with calculation time.

Block 26 can be represented by the following line of pseudocode.
  wait for exchanges
Which simply means that the program execution should wait until both blocks 22 and 24 are complete before passing control on to the next part of the program.

After, block 26 is executed the control of the system is passed to blocks 28 and 30 where additional time savings are gained in a similar fashion as blocks 22 and 24. Blocks 28 and 30 execute at the same time. This is possible because the information used by each block is independent of the other block. In other words, the operations performed at block 28 do not rely on the operations performed at block 30, and may therefore proceed at the same time.

Block 28 begins what is referred to as an "allgather" process. The allgather communications process gathers the fields of far away groups and distributes the field information to all processors in the network. The fields are needed for all right hand sides (look angles) and all far field directions. Therefore, the amount of the information to be distributed is very large and requires a large amount of memory. Preferably, the allgather functions are divided into portions which are subdivided by far field direction. That is, an allgather is done for all right hand sides for only a portion of far field directions at a time. By segmenting allgathers according to far field directions, the buffer size at each node on the network can be reduced. While the segmented allgathers are being completed by block 28, block 30 is calculating field interactions for nearby groups. Block 30 uses the information that was exchanged in block 22 to calculate the field interactions of nearby groups. Once again, because the calculations for block 30 are rather large, the allgather communications of block 28 are virtually time invisible. Blocks 28 and 30, may be of equal or different duration, however only the longest of the two contributes to the overall time cost. Preferably, the allgather segments of block 28 are completed before the nearby field interaction calculations of block 30 are completed.

Block 28 can be implemented using the following pseudocode.
  for i∈1 . . . C
    allgather (s(1 . . . Q,1 . . . M,(i-1)K/C+1 . . . iK/C))
The function allgather should be executed C (number of segments in far field directions) times for all look angles Q and all groups M in all far field directions K. This function is segmented in K by C to conserve buffer space.

The functionality of block 30 may be represented by the following pseudocode.
while allgather not finished or else nearpairs≠0
  (m,m')=remove_head(nearpairs)
  for a∈1 . . . $A_m$;a'∈1 . . . $A_{m'}$ $Z'(a,a') = G(|x_{ma} - x_{m'a'}|)$ for q∈1 . . . Q; a∈1 . . . $A_m$ $B(q,m,a) = B(q,m,a) + \Sigma_{a'\in 1 \ldots Am'} Z'(a,a') I(q,m',a')$ While an allgather is in progress, or when there are more near pair field interactions to be calculated, calculate the nearby interactions for groups m and m' for all look angles q. Note that the set "nearpairs" represents all nearby groups m and m'. Also note, the routine remove_head(S) removes the first elements from the set S.

Control is then passed to block 32 which calculates the translation operator. As stated previously, the translation operator serves to translate all far group field information into field information which applies to particular groups. Block 34 uses the translation operator calculated in block 32 to translate and sum all field into g which represents the summed far fields at each group center.

The functionality of block 32 may be represented by the pseudocode shown.

for m∈Local (p)
        for m'∉Nearby(m); k∈(i−1)K/C+1 . . . iK/C $$T(m',k) = T_{mm'}(\cos^{-1}(\underline{k} \cdot \underline{X}_{mm'}))$$

For all far away groups m' and all far field directions in the current segment calculate the translation operator T(m',k).

Block 34 may be implemented as shown in the pseudocode below.

for q∈1 . . . Q; k∈(i−1)K/C+1 . . . iK/C $$g(q,m,k) = \Sigma_{m' \notin Nearby(m)} T(m',k) s(q,m',k)$$

That is, calculate the result g(q,m,k) for all look angles and all far field directions in the current segment using the translation operator calculated in block 32.

Block 36 then calculates the interaction at each current element based on the sum of the far fields at each group center which were calculated by block 34.

Block 36 may be represented by the pseudocode below.

for m∈Local (p)
        for k∈1 . . . K; a∈1 . . . $A_m$ $$V(k,a) = e^{-ik(x_{ma}-x_m)}$$

for q∈1 . . . Q; a∈1 . . . $A_m$ $$B(q,m,a) = B(q,m,a) + \Sigma_{k \in 1 \ldots K} V(k,a) g(q,m,k)$$

return B

For all groups m on the local processor, all far field directions, and all group segments, calculate V(k,a). Also, for all look angles Q and all group segments, calculate the final result B(q,m,a) based on V(k,a) and g(q,m,k) previously calculated. Finally, return the result B to the user.

Of course, it should be understood that a range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. A method of calculating scatter values according to a fast multipole method using a parallel multi-processor system including a plurality of processors in communication with each other via a communications medium, said plurality of processors each comprising scatter programming instructions that divide a scatterer into a plurality of segments; collect said plurality of segments into groups, wherein some of said groups are nearby one another and some of said groups are not nearby one another, said groups that are nearby one another being called nearby groups and said groups that are not nearby one another being called far groups; and perform selected operations associated with scatter calculations, the method comprising:

(a) sharing current vector information associated with said nearby groups between selected ones of said processors and concurrently performing initial far field calculations;

(b) after step (a) is completed, distributing field information to said plurality of processors and calculating interactions between said nearby groups, said step of distributing field information comprising performing an allgather operation, which results in a plurality of allgather functions and dividing said plurality of allgather functions into portions which are subdivided by far field direction;

(c) computing a translation operator to translate all of said portions which are subdivided by far field direction into far field information which applies to particular groups;

(d) using said translation operator and translating and summing said far field information to calculate a value which represents summed far fields at each group center, and (e) calculating an interaction at each of said plurality of segments based on the value calculated in the previous step.

2. The method of claim 1 wherein said field information is substantially independent of said calculation of interactions between nearby groups.

3. The method of claim 1, wherein said distributing step and said calculating of interactions between nearby groups start simultaneously and complete simultaneously.

4. The method of claim 1, wherein said step of sharing current vector information and said calculating of a value which represents summed far fields at the center of each group start simultaneously and complete simultaneously.

5. The method of claim 1 wherein:

performance of said scatter calculations has an execution time; and for every processor added to said plurality of processors there is a proportional, linear decrease in said execution time.

\* \* \* \* \*